(12) United States Patent
Monshouwer et al.

(10) Patent No.: US 7,277,185 B2
(45) Date of Patent: Oct. 2, 2007

(54) METHOD OF MEASURING OVERLAY

(75) Inventors: Rene Monshouwer, Eindhoven (NL); Jacobus Hermanus Maria Neijzen, Eindhoven (NL); Jan Evert Van Der Werf, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 221 days.

(21) Appl. No.: 11/153,316

(22) Filed: Jun. 16, 2005

(65) Prior Publication Data

US 2005/0231732 A1 Oct. 20, 2005

Related U.S. Application Data

(63) Continuation of application No. 09/940,818, filed on Aug. 28, 2001, now Pat. No. 6,937,344.

(30) Foreign Application Priority Data

Dec. 27, 2000 (EP) .................................. 00204826

(51) Int. Cl.
*G01B 11/02* (2006.01)
*G01B 11/00* (2006.01)
(52) U.S. Cl. ........................ 356/508; 356/399; 356/401
(58) Field of Classification Search ..................... None
See application file for complete search history.

(56) References Cited

U.S. PATENT DOCUMENTS

| | | | |
|---|---|---|---|
| 4,251,160 A | 2/1981 | Bouwhuis et al. | |
| 4,356,392 A | 10/1982 | Wittekoek et al. | |
| 4,737,823 A | 4/1988 | Bouwer et al. | |
| 4,778,275 A | 10/1988 | van den Brink et al. | |
| 4,828,392 A * | 5/1989 | Nomura et al. | ............. 356/401 |
| 4,861,162 A | 8/1989 | Ina | |
| 5,026,166 A | 6/1991 | van der Werf | |
| 5,191,200 A | 3/1993 | van der Werf et al. | |
| 5,243,195 A | 9/1993 | Nishi | |
| 5,252,414 A | 10/1993 | Yamashita et al. | |

(Continued)

FOREIGN PATENT DOCUMENTS

EP 0 444 450 A1 9/1991

(Continued)

OTHER PUBLICATIONS

Zaidi et al., "Submicrometer Lithographic Alignment and Overlay Strategies," SPIE vol. 1343, p. 245-255, 1990.

(Continued)

*Primary Examiner*—Gregory J. Toatley, Jr.
*Assistant Examiner*—Gordon J. Stock, Jr.
(74) *Attorney, Agent, or Firm*—Pillsbury Winthrop Shaw Pittman LLP (57) ABSTRACT

In a method of measuring, in a lithographic manufacturing process using a lithographic projection apparatus, overlay between a resist layer, in which a mask pattern is to be imaged, and a substrate, use is made of an alignment-measuring device forming part of the apparatus and of specific overlay marks in the substrate and resist layer. These marks have periodic structures with periods which cannot be resolved by the alignment device, but generate an interference pattern having a period corresponding to the period of a reference mark of the alignment device.

7 Claims, 4 Drawing Sheets

U.S. PATENT DOCUMENTS

| | | |
|---|---|---|
| 5,402,224 A | 3/1995 | Hirukawa et al. |
| 5,414,514 A | 5/1995 | Smith et al. |
| 5,521,036 A | 5/1996 | Iwamoto et al. |
| 5,808,742 A | 9/1998 | Everett et al. |
| 6,278,116 B1 | 8/2001 | Wu |
| 6,727,989 B1 | 4/2004 | Yin et al. |

FOREIGN PATENT DOCUMENTS

| | | |
|---|---|---|
| EP | 0 498 499 A1 | 8/1992 |
| WO | WO 98/39689 | 9/1998 |

OTHER PUBLICATIONS

Yamashita et al., "Overlay Accuracy Measurement Technique Using the Latent Image on Chemically Amplified Resist," Jpn. J. Appl. Phys., vol. 35, p. 56-60, 1996.

Markle, "Submicron 1:1 Optical Lithography," Semiconductor International, May 1986.

* cited by examiner

METHOD OF MEASURING OVERLAY

This application is a continuation of U.S. application Ser. No. 09/940,818, filed Aug. 28, 2001, now U.S. Pat. No. 6,937,344 issued Aug. 30, 2005, the entire contents of which are incorporated herein by reference.

The invention relates to a method of measuring, in a lithographic manufacturing process using a lithographic projection apparatus, the overlay between a resist layer, in which a mask pattern is to be imaged, and a substrate, in which method use is made of at least one substrate overlay mark having a periodic structure with a period $p_1$ and a corresponding resist overlay mark having a periodic structure with a period $p_2$.

The invention also relates to a method of manufacturing devices by means of a lithographic projection apparatus, which method comprises said method of measuring overlay.

The lithographic projection apparatus is an essential tool in the manufacture of integrated circuits (ICs) by means of diffusion and masking techniques. By means of this apparatus, a number of masks having different mask patterns are successively imaged at the same position on a semiconductor substrate.

A substrate is to be understood to mean a plate of material, for example silicon, into which a complete device, such as an IC is to be formed level-wise by means of a number of successive sets of processing steps. Each of these sets comprises as main processing steps: applying a resist layer on the substrate, aligning the substrate with a mask, imaging the pattern of this mask in the resist layer, developing the resist layer, etching the substrate via the resist layer and further cleaning and other processing steps. The term substrate covers substrates at different stages in the device-manufacturing process, i.e. both a substrate having only one layer of device features and a substrate having all but one layer of device features, and all intermediate substrates.

The substrate must undergo the desired physical and chemical changes between the successive projections of the different mask patterns. To this end, the substrate must be removed from the apparatus after it has been exposed with a mask pattern. After it has undergone the desired process steps, the substrate must again be placed at the same position in the apparatus so as to expose it with a second mask pattern, and so forth. It must then be ensured that the images of the second mask pattern and the subsequent mask patterns are positioned accurately with respect to device features already formed in the substrate. To this end, the lithographic projection apparatus is provided with an alignment system with which alignment marks on the substrate are aligned with respect to alignment marks on the mask. This alignment system comprises an optical alignment-measuring device for measuring alignment deviations.

Here, alignment is understood to mean the process of ensuring mask-to-substrate registration when the wafer is in the projection apparatus. Overlay is understood to mean the degree of after-the-exposure registration of a given level mask pattern and a subsequent level mask patter. Alignment is carried out by means of mask alignment marks and substrate alignment marks. Alignment is a necessary step in the manufacturing process of devices, like ICs, but does not guarantee sufficient overlay of a first level pattern and a second level pattern formed in the substrate because of many error factors involved. Overlay accuracy mainly depends on the wafer stage accuracy, the accuracy of the alignment-measuring device, the magnification error induced by substrate deformation and the pattern placement accuracy on the mask. Higher overlay accuracy is required as the dimensions of the device features decrease. Accurate and reliable overlay measurement thus becomes more and more important in order to correct overlay errors.

In a conventional overlay error correction procedure, after a first substrate level has been provided with the required pattern, the pattern for a subsequent substrate level is imaged in a resist deposited on the substrate. The substrate is then removed from the projection apparatus and the resist is developed and the overlay between the developed pattern image and the pattern of the first substrate level is measured in a stand-alone accuracy measuring system, usually a scanning electron microscope (SEM). The overlay error correction factors are calculated and supplied to the projection apparatus, also called exposure apparatus, to correct the overlay. After the overlay error correction has been performed, all wafers of a batch are exposed.

For measuring overlay, conventionally a method known as the "KLA method" is accuracy used. In this method, overlay marks of the box-in-box type are used. The overlay mark of the first level and that in the resist layer have the same shape, usually a close contour such as a square, but the dimensions of one mark are smaller than those of the other mark so that the first mark fits within the other mark. Orientation of the marks relative to each other and the distances between the corresponding contour lines of the two marks is measured to determine the overlay accuracy.

The article: "Submicrometer lithographic alignment and overlay strategies" in: SPIE Vol. 1343 X-ray/EUV Optics for Astronomy, Microscopy, Polarimetry and Projection Lithography (1990), pages 245-255 discloses that an optical Moiré technique may be used to measure alignment as well as overlay accuracy. The Moiré pattern is produced by two gratings having different periods or different orientations of their grating strips. One experiment for superposing these gratings and observing their effect when illuminating them is described. The two gratings are imaged one after the other in the same resist layer without developing the resist between the exposures. As to the overlay measurement, it is only remarked that the multiplication of the shift between the small period gratings provided by the generated Moiré fringes having a larger period results in a powerful technique for measuring overlay between the two gratings. In addition thereto, it is remarked that the phase of the difference fringe pattern, i.e. the Moiré pattern, relative to an external reference such as the edge of the grating mark gives a direct measurement of the overlay, without explaining how such a comparison should be implemented.

It is an object of the invention to provide a method of measuring overlay, which does not need a stand-alone measuring system and makes efficient use of the potentials of a lithographic projection apparatus. This method is characterized in that use is made of an alignment-measuring device, forming part of the apparatus and intended for measuring the alignment of a substrate alignment mark having a periodic structure with a period $p_s$ which is substantially larger than the period $p_1$ and $p_2$, with respect to a reference mark having a periodic structure with a period $p_r$, adapted to the period $p_s$, and in that an interference pattern, which is generated upon illumination of the substrate overlay mark and the resist overlay mark and has a period $p_b$, adapted to the period pr, is imaged on said reference mark by means of alignment beam radiation.

The novel method includes a new use of an existing alignment measuring system for measuring the overlay between two small period gratings having slightly different grating periods.

The periods $p_1$ and $p_2$ of the substrate overlay mark and the resist overlay mark, respectively, are preferably of the order of the resolving power of the projection system. Because of the small periods, small overlay errors can be measured with the new method. The period of the interference pattern, or Moiré pattern, is determined by the periods of the substrate alignment mark and, the resist alignment mark. By proper choice of the periods $p_1$ and $p_2$, the period of the interference pattern can be made equal to the period of a conventional substrate alignment mark so that the method can be carried out with a conventional alignment device. The actual overlay errors are magnified by the new method and a small overlay error results in a considerably larger displacement of the interference pattern with respect to the reference alignment mark and in a considerable change in the overlay signal from the alignment unit. This means that less interpolation of the detector signal is needed so that a considerably more accurate measurement becomes possible. As the overlay error signal provided by the new method is an averaged signal over a relatively large area, this signal is less sensitive to local surface deformations.

It should be noted that the article: "Overlay Accuracy Measurement Technique Using the Latent Image on a Chemically Amplified Resist" in: Jpn. J. Appl. Phys. Vol. 35 (1996) pp. 55-60 discloses that the alignment sensor included in the exposure apparatus may be used to measure overlay accuracy, so as not to reduce the throughput of the apparatus. However, only one overlay grating mark is used. Two laser beams are projected on this mark and interfere with each other, thereby producing a beat signal. The phase of this beat signal, information about the displacement of the overlay mark, is detected by comparing the phase shift with the phase of a reference beat signal.

The alignment-measuring device used for measuring the overlay may be a so-called on-axis device wherein a substrate alignment mark is directly imaged on a mask alignment mark via the projection system, for example a projection lens system, of the apparatus. This device is also known as the through-the-lens (TTL) alignment device. The alignment device may also be an off-axis device. In this device, a substrate alignment mark is imaged on a reference alignment mark arranged outside the field of the projection system of the apparatus. In a very promising embodiment of the off-axis device, a substrate alignment mark is aligned with respect to an alignment mark on the substrate holder via a reference mark which is arranged outside the projection column. During this first alignment step, the substrate holder with the substrate is positioned outside the projection column. After the first alignment step has been performed, the substrate holder is positioned in the projection column, and in a second alignment step the substrate alignment mark is imaged on a mask alignment mask via the projection lens.

A lithographic projection apparatus may not only be used for the manufacture of ICs but also for the manufacture of other structures having structure details of the order of 1 μm and smaller. Examples are structures of integrated, or planar, optical systems, guiding and detection patterns of magnetic domain memories, structures of liquid crystal display panels and magnetic heads. Also in the manufacture of these structures, images of mask patterns must be aligned very accurately with respect to a substrate.

The lithographic projection apparatus may be a stepping apparatus or a step-and-scan apparatus. In a stepping apparatus, the mask pattern is imaged in one run on an IC area of the substrate. Subsequently, the substrate is moved with respect to the mask in such a way that a subsequent IC area will be positioned under the mask pattern and the projection lens system and the mask pattern is imaged on the subsequent IC area. This process is repeated until all IC areas of the substrate are provided with a mask pattern image. In a step-and-scan apparatus, the above-mentioned stepping procedure is also followed, but the mask pattern is not imaged in one run but via scanning movement. During imaging of the mask pattern, the substrate is moved synchronously with the mask with respect to the projection system and the projection beam, taking the magnification of the projection system into account. A series of juxtaposed partial images of consecutively exposed parts of the mask pattern is imaged in an IC area. After the mask pattern has been completely imaged in an IC area, a step is made to a subsequent IC area. A possible scanning procedure is described in the article: "Sub-micron 1:1 Optical Lithography" by D. A. Markle in the magazine "Semiconductors International" of May 1986, pp. 137-142.

U.S. Pat. No. 4,251,160 discloses an optical lithographic projection apparatus intended for the manufacture of ICs and provided with a single on-axis alignment unit. The substrate and mask alignment marks are gratings. A double on-axis alignment unit for aligning a first and a second substrate alignment mark with respect to a first and a second mask alignment mark, respectively, is disclosed in U.S. Pat. No. 4,778,275. Patent Application WO 98/39689 discloses an off-axis alignment unit and U.S. Pat. No. 5,243,195 discloses an alignment system comprising both an on-axis alignment unit and an off-axis alignment unit.

For determining the overlay error from the position of the image of the interference pattern with respect to the reference alignment mark, a further reference mark is needed. An embodiment of the measuring method, wherein such a further reference mark is used, is characterized in that use is made of a substrate reference, mark having substantially the same period as the interference pattern, the substrate reference mark is imaged on the reference mark and the difference between the positions of the image of the interference pattern and that of the substrate reference mark with respect to the reference alignment mark is determined.

Said difference between the positions is a measure of the shift between the substrate overlay mark and the resist overlay mark. The substrate reference mark may be constituted by a global alignment mark.

A global alignment mark is understood to mean an alignment mark having a periodic structure for aligning a substrate as such with respect to a reference alignment mark such as a mask alignment mark. The period of the global alignment mark is substantially larger than the resolution limit of the projection system by means of which the global substrate alignment mark is imaged on the wafer alignment mark, which in principle, is a global alignment mark.

The alignment marks used with the measuring method may have different structures, provided that they are periodic. The so-called Siemens star is such a periodic alignment mark that is already used in the optical lithography technique.

Preferably, the method is characterized in that, use is made of gratings for the substrate overlay mark, and the resist overlay mark and the reference mark.

Grating structures have proved to be very suitable as alignment marks.

The resist overlay mark is formed in the resist layer by imaging a corresponding mark provided on the mask outside the mask pattern in the resist layer by means of the lithographic apparatus. The area of the substrate layer where the mark image is located may be developed and the developed mark image may be used for carrying out the measuring method.

Preferably, the method is characterized in that the resist overlay mark is a latent mark.

A latent mark is understood to mean a latent, or non-developed, image of a mask mark. A resist layer with such a latent image comprises areas, which are linear areas in the case of a grating mark, which have a difference phase effect on an incident beam than their surroundings. These effects are due to the intensity variations in the beam that images the mar, which variations cause local changes of the refractive index in the layer and local shrinkage of this layer. Due to these phase effects, the latent overlay mark is discernible by the alignment beam. The advantage of using a latent overlay mark is that the substrate with the mark image in the resist layer does not need to be removed from the lithographic apparatus for developing this image.

The invention may be implemented in different ways resulting in different embodiments of the measuring method.

A first embodiment is characterized in that an on-axis alignment device is used and in that the reference mark is a mask alignment mark.

In this embodiment, the interference pattern is imaged on a mask alignment mark by means of the projection system that is intended for projecting mask patterns onto the substrate.

This embodiment is preferably further characterized in that the interference pattern is imaged on a mask alignment mark via an optical filter, which selects diffraction orders of the radiation from the overlay marks to proceed to said mask alignment mark.

This optical filter, or diaphragm, prevents noise radiation, caused for example by false reflection at components in the apparatus, from reaching the detector. By selecting, for example, only the first diffraction orders for imaging the interference pattern on the mask alignment mark, the accuracy of the overlay measurement can be increased by a factor of two.

A second embodiment of the method is characterized in that an off-axis alignment device is used.

The interference pattern is imaged on a reference alignment mark forming part of an off-axis alignment device that is located next to the projection lens. With this device, a number of diffraction orders of the alignment radiation from the substrate, for example the first to the seventh order, can be detected separately. The mask is also aligned with respect to the off-axis alignment device, so that the substrate and the mask are aligned in an indirect, or two-step, way. An advantage of the use of an off-axis alignment method is that it is largely insensitive to CMP process parameters.

This invention also relates to a method of manufacturing devices in at least one layer of substrates, which method comprises at least one set of the following successive steps:

aligning a mask provided with at least one overlay mark with respect to a first substrate;

imaging, by means of projection radiation, the overlay mark in a resist layer on the substrate;

determining the overlay between the overlay mark formed in the resist layer and an overlay mark in the substrate and correcting overlay errors;

imaging, by means of projection radiation a mask pattern comprising pattern features corresponding to device features to be configured in said layer in a resist layer on each substrate wherein the device features are to be formed, and removing material from, or adding material to, areas of said layer, which areas are delineated by the mask pattern image. This method is characterized in that the overlay is determined by means of the method as described herein before.

These and other aspects of the invention are apparent from and will be elucidated, by way of non-limitative example, with reference to the embodiments described hereinafter.

Figure 1:
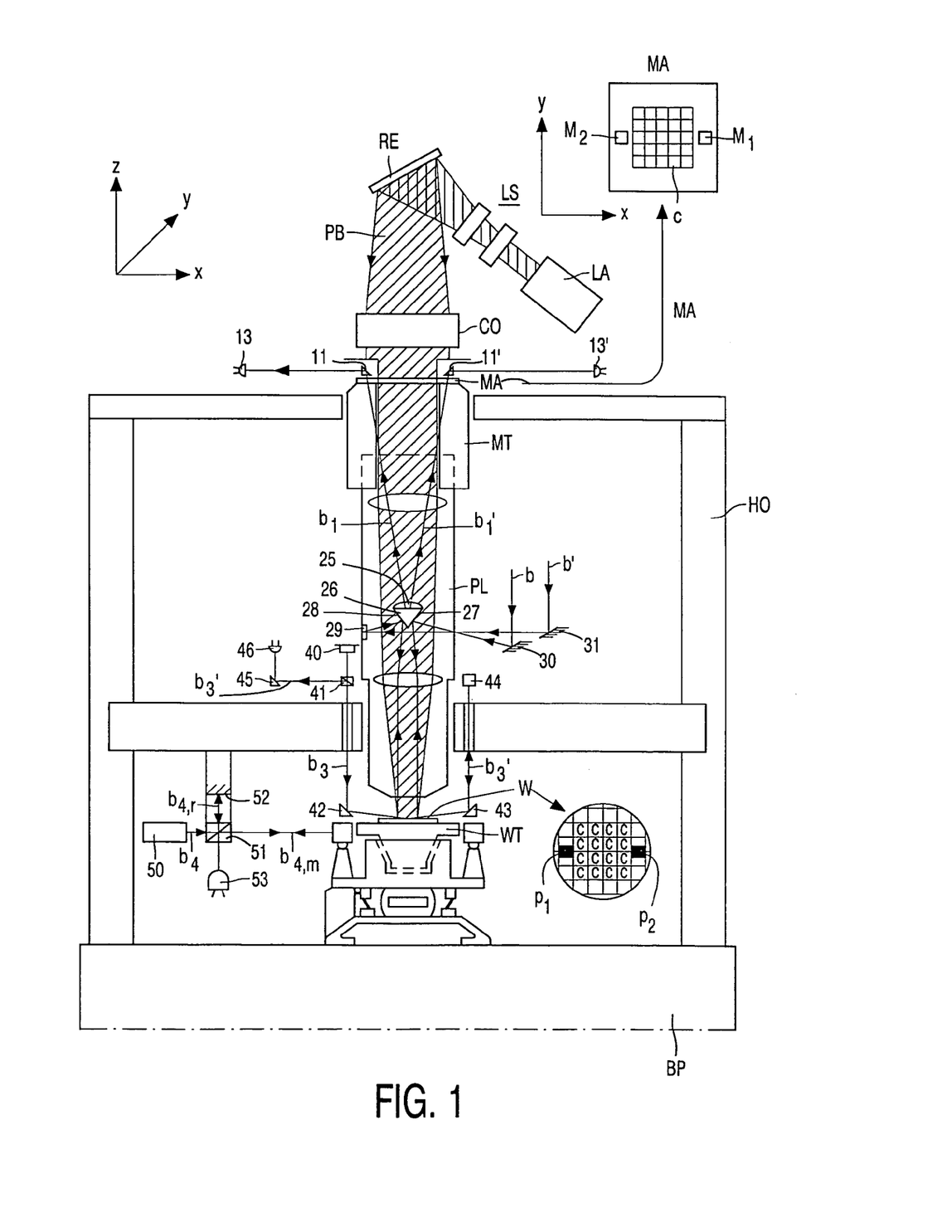
FIG. 1 shows an embodiment of a lithographic projection apparatus for repetitively imaging a mask pattern on a substrate.

FIG. 1 shows the principle and an embodiment of a lithographic projection apparatus for repetitively imaging a mask pattern on a substrate. The main components of this apparatus are a projection column, in which a mask MA provided with a mask pattern C to be imaged is arranged, and a movable substrate table WT; by means of which the substrate W can be positioned with respect to the mask pattern. The apparatus further comprises an illumination unit, which consists of a radiation source LA, for example a Krypton-Fluoride laser, a lens system LS, a reflector RE and a condenser lens CO. The projection beam PB supplied by the illumination unit illuminates the mask pattern C present in the mask MA which is arranged on a mask holder (not shown) in the mask table MT.

The projection beam PB passing through the mask pattern C traverses a projection lens system PL arranged in the projection column and shown only diagrammatically. The projection system successively forms an image of the pattern C in each of the IC areas, or substrate fields, of the substrate W. The projection lens system has, for example a magnification M of ¼, a numerical aperture of the order of 0.5, or larger, and a diffraction-limited image field with a diameter of the order of 0.25. These numbers are arbitrary and may vary with every new generation of the projection apparatus. The substrate W is arranged in a substrate holder (not shown) which forms part of a substrate table WT supported in, for example, air bearings. The projection lens system PL and the substrate table WT are arranged in a housing HO which is closed at its lower side by a base plate BP of, for example granite, and at its upper side by the mask table MT.

As is shown in the top right-hand corner of FIG. 1, the mask has two alignment marks $M_1$ and $M_2$. These marks preferably consist of diffraction gratings, but they may be alternatively formed by other periodic structures. The alignment marks are preferably two-dimensional, i.e. they extend in two mutually perpendicular directions, the X and Y directions in FIG. 1. The substrate W, for example a semi-conductor substrate or wafer, comprises a plurality of alignment marks, preferably also two-dimensional diffraction gratings, two of which $P_1$ and $P_2$, are shown in FIG. 1. The marks $P_1$ and $P_2$ are located outside the substrate fields where the images of the mask pattern must be formed. The substrate alignment marks $P_1$ and $P_2$ are preferably formed as phase gratings and the mask alignment marks $M_1$ and $M_2$ are preferably formed as amplitude gratings.

Figure 2:
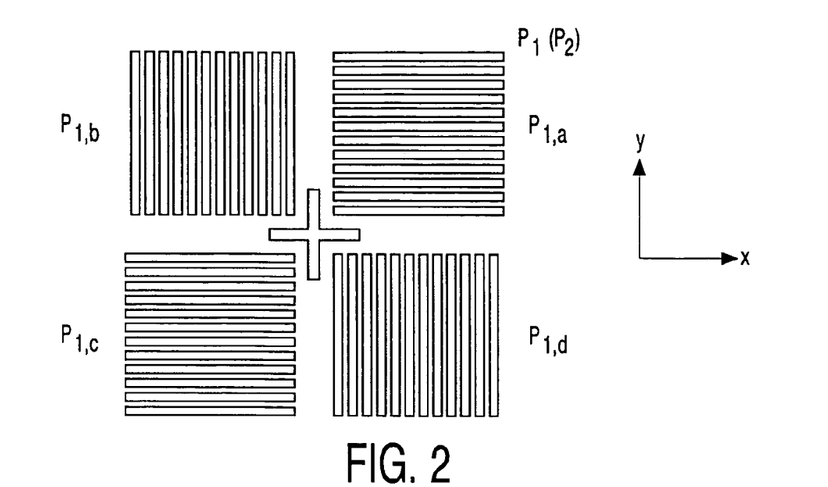
FIG. 2 shows an embodiment of a global substrate alignment mark.

FIG. 2 shows one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for measuring alignment in the X direction and the two other sub-gratings, $P_{1,a}$ and $P_{1,c}$ are used for measuring alignment in the Y direction. The two sub-gratings $P_{1,b}$ and $P_{1,c}$ have a grating period of, for example, 16 μm and the sub-gratings $P_{1,a}$ and $P_{1,d}$ have a grating period of, for example, 17.6 μm. Each sub-grating may cover a surface area of, for example, 200×200 μm$^2$. An alignment accuracy which, in principle, is less 0.1 μm can be achieved with these grating marks and a suitable optical system. Different grating periods for the sub-gratings have been chosen so as to increases the capture range of the alignment-measuring device.

FIG. 1 shows a first embodiment of an alignment-measuring device, namely a double alignment-measuring device. In this device, two alignment beams b and b' are used for measuring the alignment of the substrate alignment mark $P_2$ with respect to the mask alignment mark $M_2$, and the substrate alignment mark $P_1$ with respect to the mask alignment mark $M_1$, respectively. The alignment-measuring beam b is reflected to the reflective surface 27 of a prism 26 by means of a reflective element 30, for example, a mirror. The surface 27 reflects the beam b to the substrate alignment mark $P_2$ which sends a part of the radiation as beam $b_1$ to the associated mask alignment mark $M_2$ where an image of the mark $P_2$ is formed. A reflecting element 11, for example a prism, which directs the radiation passed by the mark $M_2$ to a radiation-sensitive detector 13 is arranged above the mark $M_2$.

Figure 3:
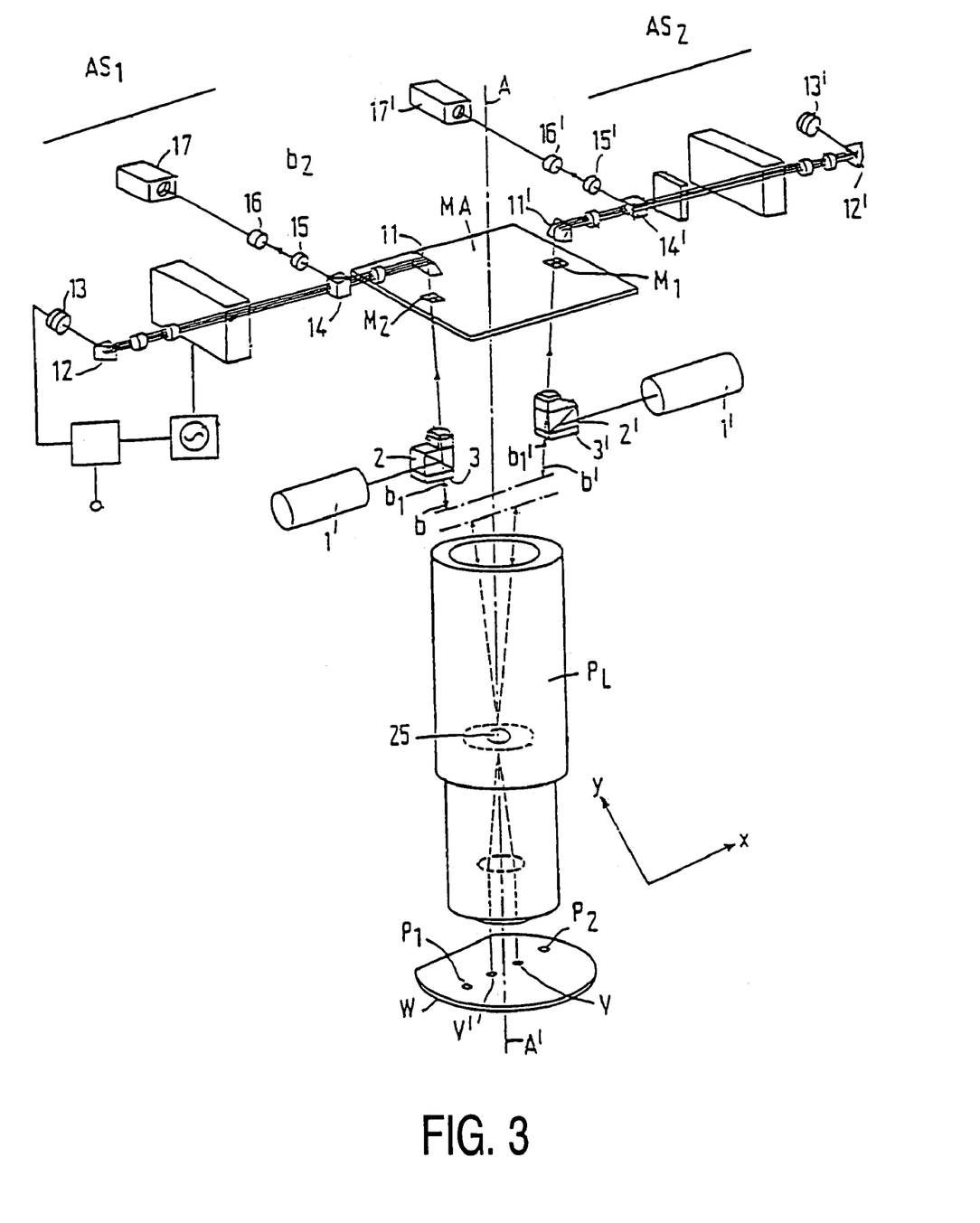
FIG. 3 shows an embodiment of a double alignment-measuring device by means of which the novel overlay measuring method can be performed.

The second alignment measuring beam b' is reflected to a reflector 29 in the projection lens system PL by a mirror 31. This reflector sends the beam b' to a second reflecting surface 28 of the prism 26, which surface directs the beam b' onto the substrate alignment mark $P_1$. This mark reflects a part of the radiation of the beam b' as a beam $b_1'$ to the mask alignment mark $M_1$ where an image of the mark $P_1$ is formed. The radiation of the beam $b_1'$ passing through the mark $M_1$ is directed towards a radiation-sensitive detector 13' by a reflector 11'. The operation of the double alignment-measuring device will be further described with reference to FIG. 3 showing a further embodiment of such a device.

The projection apparatus further comprises a focus-error detection system for determining a deviation between the image plane of the projection lens system PL and the surface of the substrate W. A measured deviation can be corrected, for example, by moving the projection lens system with respect to the substrate holder along the optical axis of the projection lens system. The focus error detection system may be constituted by the elements 40 to 46, which are arranged in a holder (not shown) which is fixedly connected to the holder of the projection lens system. Element 40 is a radiation source, for example a diode laser, emitting a focus-detection beam $b_3$. This beam is directed to the substrate W at a small angle by a reflecting prism 42. The focus-detection beam reflected by the substrate is directed to a retroreflector 44 by a prism 43. The retroreflector reflects the beam in itself, so that the focus-detection beam once more transverses the same path, now as beam $b_3'$, via reflection on the prism 43 to the substrate and from this substrate to the prism 42. The reflected focus-detection beam then reaches a beam splitter 41, which reflects the beam to a further reflector 45. This reflector sends the focus-detection beam to a radiation-sensitive detection system 46. This detection system consists of, for example a position-sensitive detector or of two separate detectors. The position of the radiation spot formed by the beam $b_3'$ on the detection system is dependent on the extent to which the image plane of the projection lens system coincides with the surface of the substrate W. For an extensive description of the focus error detection system, reference is made to U.S. Pat. No. 4,356,392.

Instead of this focus detection system with a monochromatic focus-detection beam, a focus-and-tilt detection system with a broadband beam is preferably used. Such a broadband focus-detection system is described in U.S. Pat. No. 5,191,200.

In order to determine the X and Y positions of the substrate very accurately, the apparatus comprises a composite interferometer system having a plurality of measuring axes, of which only a one-axis sub-system is shown in FIG. 1. This sub-system comprises a radiation source 50, for example a laser, a beam splitter 51, a stationary reference mirror 52 and a radiation-sensitive detector 53. The beam $b_4$ emitted by the source 50 is split by the beam splitter into a measuring beam $b_{4,m}$ and $b_4$. The measuring beam reaches the measuring mirror in the form of a reflective surface of the substrate table, or preferably a reflective side surface of the substrate holder which forms part of the substrate table and on which the substrate is rigidly secured. The measuring beam reflected by the measuring mirror is combined by the beam splitter 51 with the reference beam reflected by the reference mirror 52 so as to form an interference pattern at the location of the detector 53. The composite interferometer system may be implemented as described in U.S. Pat. No. 4,251,160 and then comprises two measuring axes. The interferometer system may alternatively comprise three measuring axes as described in U.S. Pat. No. 4,737,823, but is preferably a system with at least five measuring axes as described in EP-A 0 498 499.

By making use of a substrate position detection system in the form of a composite interferometer system, the positions of, and the mutual distances between, the alignment marks $P_1$ and $P_2$ and the marks $M_1$ and $M_2$ can, be fixed during alignment in a system of co-ordinates defined by the interferometer system. Thus it is not necessary to refer to a frame of the projection apparatus or to a component of this frame, so that variations in this frame due to, for example temperature variations, mechanical creep and the like do not affect the measurements.

FIG. 3 shows the principle of the double alignment system with reference to an embodiment which is distinguished from that of FIG. 1 by a different manner of coupling the alignment beams b and b' into the projection lens system. The double alignment device comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the elements of the system $AS_2$ being distinguished by their primed notation.

The structure of the system $AS_1$ as well as the way in which the mutual position of the mask alignment mark $M_2$ and, for example, the substrate alignment mark $P_2$ is determined will now be described first.

The alignment system $AS_1$ comprises a radiation source 1, which emits an alignment beam b. This beam is reflected towards the substrate by a beam splitter 2. The beam splitter may be a partially transparent reflector or a partially transparent prism, but is preferably a polarization-sensitive splitting prism, which is succeeded by a quarter-wavelength plate 3. The projection lens system PL focuses the alignment beam b to a small radiation spot V having a diameter of the order of 1 mm on the substrate W. This substrate reflects a part of the alignment beam as beam $b_1$ in the direction of the mask MA. The beam $b_1$ traverses the projection lens system PL, which system images the radiation spot on the mask. Before the substrate is arranged in the projection column, it has been pre-aligned in a pre-alignment station, for example the station described in U.S. Pat. No. 5,026,166, so that the radiation spot V is located on the substrate alignment mark $P_2$. This mark is then imaged by the beam $b_1$ on the mask alignment mark $M_2$. The dimensions of the mask alignment mark $M_2$ are adapted to those of the substrate alignment mark $P_2$, taking the magnification M of the projection lens system into account. The image of the mark $P_2$ then accurately coincides with the mark $M_2$ if the two marks are mutually positioned in the correct manner.

On their paths to and from the substrate W, the alignment measuring beams b and $b_1$ have traversed twice the quarter-wavelength plate 3 whose optical axis extends at an angle of 45° to the direction of polarization of the linearly polarized beam coming from the source 1. The beam passing through the plate 3 then has a direction of polarization that is rotated 90° with respect to that of the beam b, so that the beam $b_1$ is passed by the polarization-sensitive prism 2. The use of the polarization-sensitive prism in combination with the quarter-wavelength plate provides the advantage of a minimum radiation loss when coupling the alignment-measuring beam into the radiation path of the alignment system.

The beam $b_1$ passed by the alignment mark $M_2$ is reflected by a prism 11 and directed, for example, by a further reflecting prism 12 towards a radiation-sensitive detector 13. This detector is, for example, a composite photodiode having, for example, four separate radiation-sensitive areas in conformity with the number of sub-gratings according to FIG. 2. The output signals of the sub-detectors comprise information about the extent to which the mark $M_2$ coincides with the image of the mark $P_2$. These signals may be processed electronically and used for moving the mask with respect to the substrate by means of driving systems (not shown) so that the image of the substrate alignment mark $P_2$ coincides with the mask alignment mark $M_2$.

A beam splitter 14 splitting a part of the beam $b_1$ into beam $b_2$ may be arranged between the prism 11 and the detector 13. The split-off beam is then incident via, for example, two lenses 15 and 16 on a television camera 17, which is coupled to a monitor (not shown) on which the alignment marks $P_2$ and $M_2$ are visible to an operator of the lithographic apparatus.

Analogously as described above for the alignment marks $P_2$ and $M_2$, the marks $M_1$ and $P_1$ and $M_1$ and $P_2$, respectively, can be aligned with respect to each other. The alignment-measuring system $AS_2$ is used for the last-mentioned alignments.

Preferably, a so-called order diaphragm is arranged in the path of the alignment radiation between the substrate and the mask. This diaphragm, denoted by the reference numeral 25 in FIG. 3, passes only the radiation required for the measuring operation and blocks other radiation, for example from false reflection at components in the system, so that the signal-to-noise ratio of the detector signal is improved. The alignment marks $P_1$ and $P_2$, in the form of gratings or other diffraction element, split the alignment-measuring beams incident thereon in a non-deflected zero-order sub-beam and a plurality of, deflected, first-order and higher-order sub-beams. Of these sub-beams, only those having the same diffraction order are selected by the order diaphragm. This diaphragm is arranged in the projection lens system at a position where the sub-beams diffracted in the different diffraction orders are spatially separated to a sufficient extent, for example, in the Fourier plane of the projection system. The order diaphragm 25 consists of a plate, which is non-transmissive to the alignment-measuring radiation and has a plurality of radiation-tranmissive apertures or areas. If the alignment marks have a two-dimensional structure, the plate has four apertures: two for the sub-beams diffracted in the relevant order in the plus and minus X directions and two for the sub-beams diffracted in the relevant order in the plus and minus Y directions. Moreover, an additional order diaphragm improving the selection of the desired order is preferably arranged in the detection branch, i.e. the part of the radiation path from the mask alignment mark to the detector 13, 13'. The sub-beams diffracted in the first orders are preferably used for the alignment measurement. When using only the first orders for image the substrate mark on the mask mark, the period of the image of the substrate mark is half that of the substrate grating itself, when neglecting the magnification of the projection lens system. As a result, the accuracy with which the gratings are aligned for a specific period of the grating $P_2$ is twice as high as in the case where the zero-order sub-beam was also used.

Figure 4:
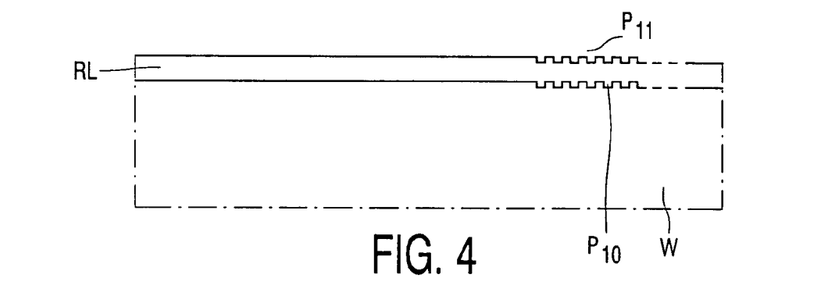
FIG. 4 shows an embodiment of a substrate overlay mark and a resist overlay mark.

According to the invention, the alignment-measuring system of FIGS. 1 and 3, or other similar systems, is used for detecting overlay of a pattern previously formed in the substrate and a pattern imaged in a resist layer provided on the substrate. The substrate pattern and the resist pattern used for the overlay measurement are specific overlay marks having a periodic structure with a period which is considerably smaller than that of substrate alignment marks used up to now. FIG. 4, shows a cross-section of a small part of the substrate W comprising a substrate overlay mark $P_{10}$ and a resist layer RL on top of the substrate comprising a resist overlay mark $P_{11}$. The substrate overlay mark and the resist overlay mark have grating periods $P_{10}$ and $PE_{11}$, respectively, which are preferably of the order of the resolving power, or resolution, of the projection lens system. These grating periods are slightly different, as is illustrated in FIG. 5.

Figure 5:
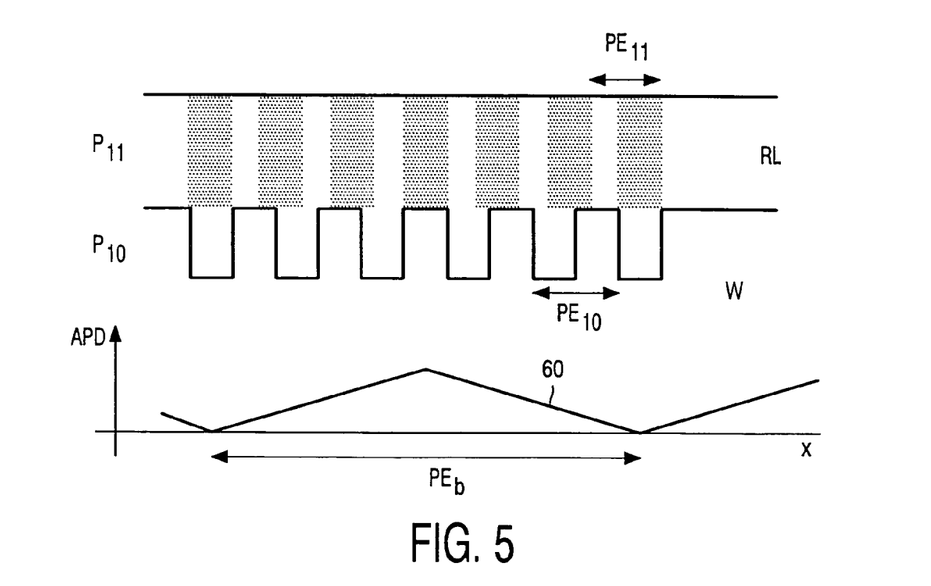
FIG. 5 is an enlarged cross-section of these marks.

The upper part of FIG. 5 shows a part of the overlay marks a in cross-section and on a very large scale. These overlay marks may be constituted by phase structures, for example phase gratings. The grating period $PE_{10}$ of the substrate overlay mark is larger than this period $P_{11}$ of the resist overlay mark, or the other way round. When illuminating these overlay marks by a radiation beam, such as the beam of the alignment-measuring device, the phase effects of these marks on the beam interfere so that an interference phase pattern, or phase image is generated. This phase pattern, which may also be called a beat pattern or beat grating, has a beat period $PE_b$ which is given by:

$$1/PE_b = 1/PE_{10} - 1/PE_{11}.$$

The graph 60 in the lower part of FIG. 5 shows the variation of the average phase depth APD of the phase pattern along the x direction, i.e. perpendicular to the grating strips of the fine substrate grating and the resist overlay grating. The phase variation or the position of the maxima and minima of the beat pattern is determined by the mutual position of the overlay gratings. In order to measure this mutual position or the mutual shift in the X direction of the overlay gratings, the beat phase pattern is imaged on an on-axis or off-axis measuring grating, or measuring mark, arranged in front of a radiation-sensitive detector. If, for this imaging, an optical system is used which can resolve the coarse beat pattern with the period $PE_b$, but not the fine overlay marks with the periods $PE_{10}$ and $PE_{11}$, only the sine-like variation of the phase pattern, i.e. the position of the beat pattern will be detected. In order to determine the mutual shift of the overlay marks from the position of the beat pattern, the latter position with respect to the measuring mark can be compared with the position of a substrate reference mark with respect to the same measuring mark. The substrate reference mark may be constituted by a global alignment mark arranged in the substrate in the neighborhood of the fine alignment mark. The measuring mark is a global mask alignment mark if an on-axis alignment-measuring device is used. The mutual position of the overlay marks can be determined in a simple way from the mutual position of the substrate reference mark and the beat pattern. A mutual shift of the overlay marks over $PE_{11}/2$ results in a shift of the beat pattern over $P_b/2$.

A small shift of the overlay marks is thus translated into a considerably larger shift of the beat pattern, i.e. this shift is magnified. The magnification factor $M_f$ is given by:

$$M_f = \text{shift}_{beat}/\text{shift}_{overlay\ marks} = PE_{10}/(PE_{11}-PE_{10})$$

Because of the magnification, less interpolation of the detector signal is needed in the overlay signal processing so that the measurement is more accurate. The magnification also decreases the sensitivity of the overlay method to artifacts such as PICO, RICO and WICO These artifacts are offsets in the overlay signal caused by the large coherence length of the measuring laser beam, for example a He—Ne laser beam. Because of the large coherence length, laser radiation which has been affected by optical components in the system may interfere with the desired signal radiation, i.e. radiation of the plus one and minus order in the described embodiment. The resulting artifacts may be induced by the polarization effects of the mask or reticle (polarization-induced coherence offset: PICO), by the thickness of the reticle (reticle induced coherence offset: RICO) or by the Z-position of the substrate or wafer (wafer-induced coherence offset: WICO). Due to the magnification, the measurement of the position of the beat pattern is not very critical. If an error $\Delta$ is made in the determination of the beat pattern position, this will result in a much smaller error of $(1/M_f).\Delta$ in the determination of the overlay. The magnification factor may be of the order of 10 or 20.

Since the measuring signal is an averaged signal taken from a relatively large substrate surface area, this signal is less sensitive to local surface deformations.

The beat period $PE_b$ may be chosen to be such that it fits that of a global mask alignment mark, i.e. an on-axis alignment mark, so that the overlay measuring method may be implemented with the on-axis alignment device of FIG. 3. After the choice for the beat period has been made, there is still the freedom to choose the feature dimensions of the overlay marks, i.e. in the case of grating marks, the periods of these gratings. It is thus possible to optimize the overlay marks for minimum sensitivity to process-induced deformations. In the case of grating marks, this means, for example, that the grating period may be of the order of the dimensions of the IC device features, which are to be projected on the substrate by the lithographic apparatus. It is expected that grating marks with such small periods are less vulnerable to said process-induced deformations.

The substrate overlay mark may be a phase mark and/or an amplitude mark. In the case of a phase mark, this mark is etched in a layer of the substrate. The resist overlay mark is preferably a phase mark. This mark may be constituted by a mark in a developed resist layer. The phase depth of such a mark is determined by the difference in refractive index of the resist and that of the surrounding medium, usually air, and the thickness of the resist. Since this difference in refractive index is fairly large, there is a strong relationship between the resist thickness and the signal strength of the alignment signal. The resist overlay mark may also be a so-called latent mark, i.e. an image of a fine alignment mark in a resist that has not been developed. Such an image comprises first areas upon which projection beam radiation has been incident and second areas for which this is not the case. These first and second areas provide different optical path lengths for the alignment-determining beam passing through them. This difference is due to either chemical changes in the first areas, which changes cause a change in the refractive index in these areas or to material shrinkage in these areas resulting in a height difference between the first and second areas. These effects are modest, and for the usual resist thickness, no oscillatory change of the alignment signal with resist thickness will occur. Using a latent overlay mark provides the advantage that the substrate with the resist layer does not need to be removed from the lithographic apparatus for development of the resist.

In the same way as for the alignment-measuring method, the new overlay-measuring method can be improved by using a spatial, or diffraction order, filter, or diaphragm. This filter transmits, for example, only the first orders sub-beams from the beat pattern. This filter may be similar to the filter 25 of FIG. 3. The sensitivity of the overlay-measuring method to noise and other disturbances, which may occur in the alignment-measuring device, can be considerably reduced by such a filter. The advantage of using only the first order sub-beams for imaging the beat pattern on a mask grating is that the period of the pattern image is half that of the pattern itself, irrespective of the magnification of the projection lens system. As a result, the alignment accuracy is twice as high as in the case the zero order sub-beam was also used for imaging.

Figure 6:
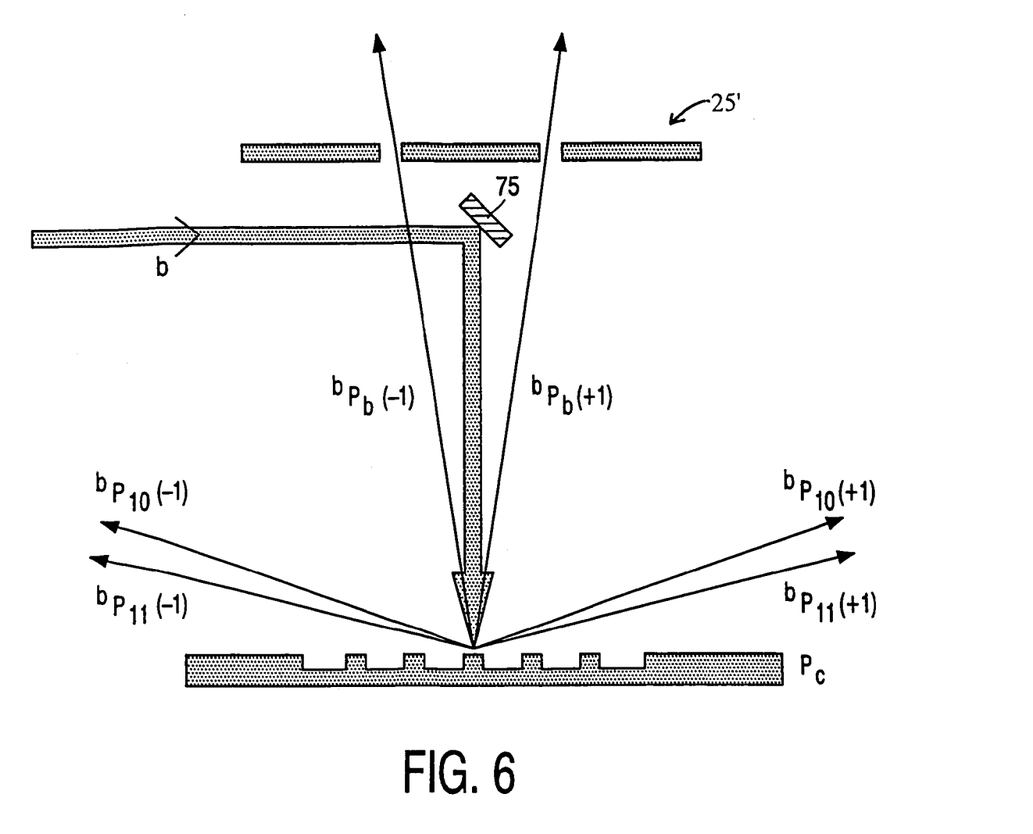
FIG. 6 shows an order filter of the on-axis alignment measuring device and first-order sub-beams generated by the overlay marks.

FIG. 6 illustrates diagrammatically the method wherein an order filter 25' is used. In this Figure, b is the overlay measuring beam and 75 is a reflector which couples the beam b into the projection column comprising the projection lens system, not shown, of the lithographic apparatus. The optical axis of the projection lens system coincides with the vertical part of the path of the beam b. The substrate overlay mark and the resist overlay mark and the beat pattern generated by them are schematically represented by the grating structure $P_c$, which is a composite structure. The sub-beans $b_{Pb}(+1)$ and $b_{Pb}(-1)$ are the overlay beam portions which are diffracted by the grating structure in the plus first diffraction order and the minus first diffraction order, respectively. These sub-beams pass through the openings in the spatial, or order, filter to a mask alignment mark and a detector. The sub-beams of other diffraction orders are blocked by the filter and thus cannot reach the detector.

FIG. 6 also shows, for illustrative purposes, the sub-beams $bp_{10}(+1)$ and $bp_{10}(-1)$, would be diffracted in the plus and minus first orders by the fine substrate overlay granting $P_{10}$ alone, as well as the sub-beams $bp_{11}(+1)$ and $bp_{11}(-1)$ which would be diffracted in the plus and minus first orders by the fine resist overlay grating $P_{11}$ alone. Due to the small periods of these fine gratings, the diffraction angles are so large that these sub-beams do not even enter the projection lens system. This means that the alignment device images only the beat pattern rather than an individual fine overlay mark.

The new method may also be used for two-dimensional alignment, i.e. alignment in both the X direction and the Y direction. The substrate fine alignment mark and the additional alignment mark should then comprise both grating strips extending in the Y direction and grating strips extending in the X direction, in a similar way as shown in FIG. 2 for the global alignment mark.

Instead of using the on-axis alignment-measuring device shown in FIGS. 1 and 3, other on-axis alignment-measuring devices may also be used to perform the overlay-measuring method.

The projection system, which is used, inter alia, for imaging the beat pattern on the mask alignment mark may not be a lens projection system but a mirror system or a system comprising lenses and mirrors. A mirror projection system will be used in an apparatus, such as an EUV apparatus, wherein the projection beam has such a small wavelength that no suitable lens material is available.

The new method may also be implemented with an off-axis alignment measuring device, for example a device by means of which the alignment of a substrate mark relative to a reference is determined and wherein higher order sub-beams, i.e. sub-beams having a diffraction order which is higher than 1, are used. Since the overlay measuring no longer takes place through the projection system, there will be a greater freedom to use more sub-beams, particularly higher order sub-beams. Since, in general, the resolving power of the alignment-measuring device increases with an increasing order number of the sub-beams, the accuracy of the overlay measuring can be enhanced considerably. Moreover, it is also possible to use overlay-measuring radiation with more than one wavelength, so that the requirements imposed on the depth of the grating grooves can be alleviated considerably.

Figure 7:
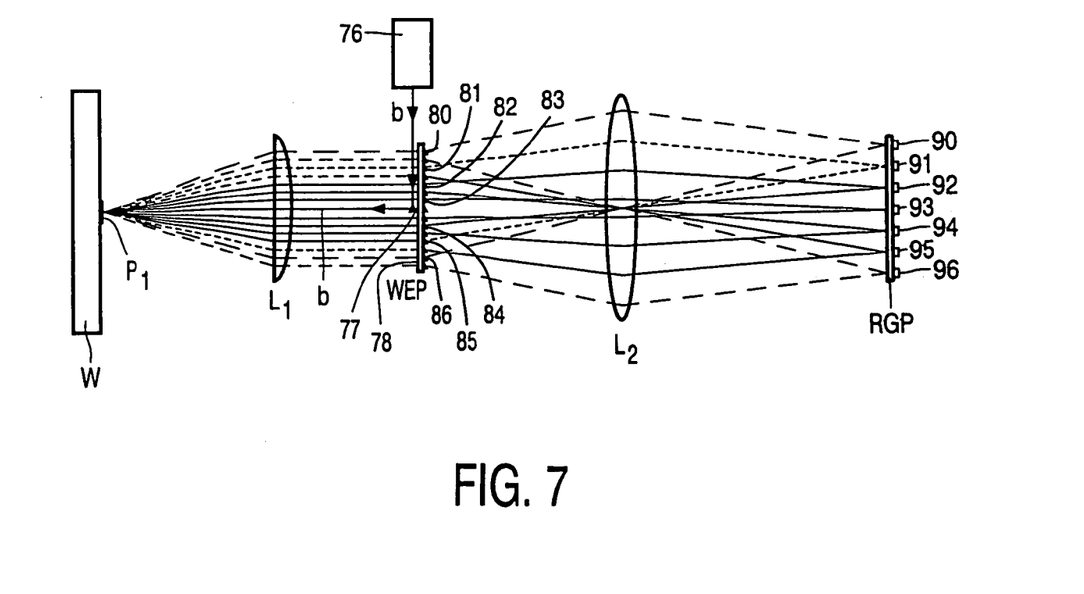
FIG. 7 shows an embodiment of an off-axis alignment-measuring device by means of which the novel overlay measuring method can be performed.

FIG. 7 is the circuit diagram of an off-axis alignment-measuring device. In this Figure, the composite substrate grating structure, including the beat pattern, is denoted by $P_1$. A parallel overlay-measuring beam b having a wavelength $\lambda$ incident on this structure is split up into a number of sub-beams extending at different angles $\alpha_n$ (not shown) to the normal on the grating, which angles are defined by the known grating formula:

$$\sin\alpha_n = N \cdot \lambda / P$$

wherein N is the diffraction order number and P the grating period. The path of the sub-beams reflected by the composite grating structure incorporates a lens system $L_1$, which converts the different directions of the sub-beams into different positions $u_n$ of these sub-beams in a plane 78:

$$u_n = f_1 \cdot \alpha_n$$

In the plane 78, means may be provided for further separating the different sub-beams. To this end, a plate may be arranged in this plane, which is provided with deflection elements in the form of, for example wedges 81-86. In FIG. 7, the wedge plate is denoted by WEP. The wedges are provided on, for example the rear side 80 of the plate. A prism 77 can then be provided on the front side of the plate, with which the overlay-measuring beam coming from the radiation source 76, for example a He—Ne laser, can be coupled into the overlay-measuring device. This prism can also prevent the 0-order sub-beam from reaching the detectors. The number of wedges corresponds to the number of sub-beams to be used. In the embodiment shown, there are six wedges per measuring direction for the plus orders so that the sub-beams up to and including the 7-order can be used for overlay-measuring. All wedges have a different wedge angle so that an optimal separation of the sub-beams is obtained.

A second lens system L2 is arranged behind the wedge plate. This lens system images the pattern $P_1$ in a plane reference plate RGP. In the absence of the wedge plate, all sub-beams would be superimposed on the reference plate. Since the different sub-beams are deflected at different angles by the wedge plate, the images formed by the sub-beams are situated at different positions on the reference plate. These positions $x_n$ are given by:

$$x_n = f_2 \cdot \gamma_n$$

wherein $\gamma$ is the angle at which a sub-beam is deflected by the wedge plate and $f_2$ is the focal length of the lens system $L_2$. Reference gratings $G_{90}$-$G96$ (not shown) can be provided at these positions, behind each of which a separate detector 90 to 96 is arranged. The output signal of each detector is dependent on the extent to which the image of the pattern $P_1$ coincides with the relevant reference grating. Hence, the extent of overlay can be measured with each detector 90 to 96. However, the accuracy with which the measurement takes place is dependent on the order number of the sub-beam used; as this order number is larger, the accuracy is greater. The grating period of each reference grating is adapted to the order number of the associated sub-beam. As the order number is larger, the grating period is smaller and a smaller alignment error can be detected.

Hitherto, only one set of diffraction orders has been considered. However in addition to +1, +2, +3 etc. order sub-beams, the diffraction structure $P_1$ also forms sub-beams of diffraction orders −1, −2, −3 etc. Both the plus-order and minus-order sub-beams can be used to form the pattern image, i.e. a first image of the pattern is formed by the +1 and +1 order jointly, a second image is formed by the +2 and −2 order sub-beams jointly, and so forth. For the +1 order and the −1 order sub-beams, no wedges need to be used, but plane-parallel plates which compensate for path-length differences can be provided at the positions of these sub-beams in the plane of the wedge plate. Thus, six wedges, both for the plus orders and for the minus orders, are required for the orders 2 to 7. Also for overlay measuring in the Y direction, seven sub-beams may be used together with seven further reference gratings. A second series of twelve wedges is then arranged on the wedge plate in the Y direction in the embodiment of FIG. 7.

For further details and embodiments of the off-axis alignment device wherein different diffraction orders may be used, reference is made to WO 98/39689. This publication also describes under which circumstances the different diffraction orders are used, and that alignment radiation having two wavelengths may be used in the off-axis alignment device. The latter provides the advantage that no stringent requirements have to be imposed on the groove depth of the substrate alignment marks.

In practice, the overlay-measuring method of the present invention will be applied as one step in a process of manufacturing a device in at least one layer of substrates, namely for regularly checking the performance of, inter alia, the alignment device. After the overlay has been measured and, if needed, correction of, inter alia, the alignment device has been carried out one substrate of a batch, a mask pattern is imaged in a resist layer on the other substrates of the batch. After this image has been developed, material is removed from, or added to, areas of said substrate layer, which areas are delineated by the printed image. These process steps of imaging and material removing or material adding are repeated for all layers until the whole device is finished, wherein more overlay-measuring steps may be carried out.

The invention has been described with reference to its use with an apparatus for imaging a mask pattern on a substrate for manufacturing ICs, but this does not mean that it is limited thereto. The invention may also be used with an apparatus for manufacturing integrated, or planar, optical systems, magnetic heads or liquid crystal panels. The projection apparatus may not only be an optical apparatus, in which the projection beam is a beam of electromagnetic radiation and the projection system is an optical lens or mirror system, but also in an apparatus wherein the projection beam is a charged-particle beam, such as an electron beam or an ion beam, or an X-ray beam, in which the associated projection system, for example an electron lens system, is used. Generally, the invention may be used in imaging systems with which images having very small details must be formed.

The invention claimed is:

1. A lithographic projection apparatus, comprising:
    an illumination system configured to provide a beam of radiation;
    a support configured to support a patterning device, the patterning device being configured to pattern the beam of radiation, and the patterning device being provided with a reference alignment mark having a first period;
    a substrate table configured to hold a substrate, the substrate being provided with a substrate overlay mark having a second period, the second period being smaller than the first period, the substrate being at least partially coated with a resist layer, the resist layer being provided with a resist overlay mark having a third period;
    a projection system configured to project the patterned beam of radiation onto a target portion of the substrate; and
    an alignment measuring system configured to measure overlay between the resist layer and the substrate by measuring an interference pattern that is generated by illuminating the substrate overlay mark and the resist overlay mark, the interference pattern having a fourth period that is larger than the second and third periods, and measuring alignment of a substrate alignment mark having a fifth period with respect to the reference alignment mark.

2. An apparatus method according to claim 1, wherein the substrate alignment mark has substantially the same period as the interference pattern, and the alignment measuring system is configured to image the substrate alignment mark on the reference alignment mark, and determine difference between positions of the image of the interference pattern and that of the substrate alignment mark with respect to the reference alignment mark.

3. An apparatus according to claim 1, wherein the substrate overlay mark, the resist overlay mark and the reference alignment mark are gratings.

4. An apparatus according to claim 1, wherein the resist overlay mark is a latent mark.

5. An apparatus according to claim 1, wherein the alignment measuring device is an on-axis alignment-measuring device, and the reference mark is a mask alignment mark.

6. An apparatus according to claim 1, wherein the interference pattern is imaged on the reference alignment mark via an optical filter, which selects diffraction orders of the radiation from the overlay marks which proceed to the reference alignment mark.

7. An apparatus according to claim 1, wherein the alignment measuring device is an off-axis alignment measuring device.

* * * * *